(12) United States Patent
Park

(10) Patent No.: US 12,504,383 B2
(45) Date of Patent: Dec. 23, 2025

(54) SUBSTRATE TEST APPARATUS AND METHOD

(71) Applicant: SEMES CO., LTD., Cheonan-si (KR)

(72) Inventor: Gyunam Park, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 168 days.

(21) Appl. No.: 18/461,960

(22) Filed: Sep. 6, 2023

(65) Prior Publication Data

US 2024/0110879 A1    Apr. 4, 2024

(30) Foreign Application Priority Data

Oct. 4, 2022   (KR) .................. 10-2022-0126559

(51) Int. Cl.
  *G01N 21/95*    (2006.01)
  *H01L 21/66*    (2006.01)
  *H01L 21/67*    (2006.01)

(52) U.S. Cl.
  CPC ... *G01N 21/9501* (2013.01); *H01L 21/67288* (2013.01); *H01L 22/12* (2013.01); *H01L 22/24* (2013.01)

(58) Field of Classification Search
  CPC .............. G01N 21/88; G01N 21/8803; G01N 21/8806; G01N 21/8851; G01N 21/95; G01N 21/9501; G01N 2021/8835; G01N 2021/8896; G01N 2021/9511; G03B 27/32; G03B 27/34; G03B 27/40; G03B 27/52; G03B 27/522; G03B 27/54; H01L 21/67005; H01L 21/67242; H01L 21/67259; H01L 21/67288; H01L 22/00; H01L 22/20; H01L 22/24; H01L 22/34

See application file for complete search history.

(56) References Cited

U.S. PATENT DOCUMENTS

| | | | |
|---|---|---|---|
| 6,031,607 A * | 2/2000 | Miyazaki | G06T 7/001 359/559 |
| 6,097,483 A * | 8/2000 | Komatsu | G01N 21/9501 356/237.4 |
| 6,288,780 B1 * | 9/2001 | Fairley | G01N 21/95623 356/394 |

(Continued)

FOREIGN PATENT DOCUMENTS

| | | |
|---|---|---|
| JP | H09-167789 A | 6/1997 |
| JP | 2022-027020 A | 2/2022 |

(Continued)

OTHER PUBLICATIONS

Korean Office Action dated Jul. 1, 2024 issued in corresponding Korean Patent Application No. 10-2022-0126559.

*Primary Examiner* — Georgia Y Epps
(74) *Attorney, Agent, or Firm* — Harness, Dickey & Pierce, P.L.C.

(57) ABSTRACT

Provided is a substrate test apparatus and method capable of testing or measuring a substrate such as a wafer by obtaining an optical image from the substrate, the substrate test apparatus including a lighting device for irradiating illumination light to a substrate, a substrate image detection device for forming an image of the substrate by receiving light reflected from the substrate, and a substrate tilt measurement device for measuring a tilt of the substrate based on a normal angle.

20 Claims, 10 Drawing Sheets

(56) References Cited

U.S. PATENT DOCUMENTS

| | | | |
|---|---|---|---|
| 6,630,996 B2* | 10/2003 | Rao | G01N 21/9501 356/237.4 |
| 7,106,419 B2* | 9/2006 | Ina | G03F 9/7011 355/53 |
| 7,141,813 B2* | 11/2006 | Kosugi | G03F 9/7069 250/548 |
| 7,164,475 B2* | 1/2007 | Fairley | G01N 21/9501 356/237.2 |
| 7,209,215 B2* | 4/2007 | Akamatsu | G03F 9/7026 355/55 |
| 7,253,885 B2* | 8/2007 | Matsumoto | G03F 9/7065 355/77 |
| 7,492,452 B2* | 2/2009 | Uto | G01N 21/956 250/548 |
| 7,551,262 B2* | 6/2009 | Matsumoto | G03F 9/7065 355/70 |
| 7,859,656 B2* | 12/2010 | Uto | G01N 21/9501 250/548 |
| 8,760,642 B2 | 6/2014 | Hori et al. | |
| RE44,977 E* | 7/2014 | Togashi | G01N 21/9501 356/237.4 |
| 9,097,991 B2 | 8/2015 | Sakamoto | |
| 10,585,296 B2* | 3/2020 | Owens | G01D 5/34746 |
| 12,073,556 B2* | 8/2024 | Park | G01N 21/9501 |
| 2002/0060789 A1* | 5/2002 | Fukazawa | G01N 21/9501 356/237.2 |
| 2003/0160195 A1* | 8/2003 | Kosugi | G03F 9/7003 73/1.79 |
| 2007/0052939 A1 | 3/2007 | Ishii et al. | |
| 2007/0171392 A1* | 7/2007 | Matsumoto | G03F 9/7011 355/77 |
| 2007/0182958 A1* | 8/2007 | Manabe | G01N 21/8851 356/237.2 |
| 2009/0141269 A1* | 6/2009 | Uto | G01N 21/9501 356/237.2 |
| 2009/0286172 A1* | 11/2009 | Sentoku | G01B 11/24 355/68 |
| 2010/0002215 A1* | 1/2010 | Sentoku | G03F 9/7034 355/55 |
| 2010/0182602 A1* | 7/2010 | Urano | G01N 21/4738 356/369 |
| 2011/0032503 A1* | 2/2011 | Sasaki | G03F 9/7034 355/72 |
| 2014/0152888 A1* | 6/2014 | Staker | G02B 27/646 348/373 |
| 2017/0289412 A1* | 10/2017 | Staker | G02B 21/16 |
| 2018/0252936 A1* | 9/2018 | Owens | G02B 26/101 |
| 2018/0373171 A1* | 12/2018 | Hugers | G01B 11/2545 |
| 2021/0366143 A1* | 11/2021 | Vaez-Iravani | G06T 7/73 |
| 2022/0392793 A1* | 12/2022 | Buxbaum | G06T 7/50 |
| 2023/0366823 A1* | 11/2023 | Bishop | G03B 13/16 |
| 2024/0110879 A1* | 4/2024 | Park | H01L 22/12 |

FOREIGN PATENT DOCUMENTS

| | | |
|---|---|---|
| KR | 10-2006-0132743 A | 12/2006 |
| KR | 10-2012-0127171 A | 11/2012 |
| KR | 10-2013-0111423 A | 10/2013 |
| KR | 10-2018-0134565 A | 12/2018 |

* cited by examiner

SUBSTRATE TEST APPARATUS AND METHOD

CROSS-REFERENCE TO RELATED PATENT APPLICATION

This application claims the benefit of Korean Patent Application No. 10-2022-0126559, filed on Oct. 4, 2022, in the Korean Intellectual Property Office, the disclosure of which is incorporated herein in its entirety by reference.

BACKGROUND OF THE INVENTION

1. Field of the Invention

The present invention relates to a substrate test apparatus and method and, more particularly, to a substrate test apparatus and method capable of testing or measuring a substrate such as a wafer by obtaining an optical image from the substrate.

2. Description of the Related Art

Various types of substrate test apparatuses capable of testing or measuring a substrate such as a wafer, a semiconductor chip, a semiconductor package, a printed circuit board, a display panel, or a glass substrate by obtaining an optical image from the substrate have been broadly developed and used.

In general, existing substrate test apparatuses may use various types of optical systems such as an illumination system for irradiating illumination light to a substrate as a target, an image system for forming an image by receiving reflected light of illumination light from a substrate, and an autofocus system for focusing automatically.

However, the existing substrate test apparatuses have many problems. For example, an accurate substrate image for testing the substrate may not be obtained or reliability or precision of the test may be greatly reduced because the substrate is tilted without maintaining a mounting angle thereof at a normal angle, e.g., a horizontal angle, for a wide variety of reasons, e.g., deformation of the substrate, presence of contaminants between the substrate and a substrate stage, misalignment of the substrate out of position, and accumulation of deformation or dislocation of various elements or components for a long time.

SUMMARY OF THE INVENTION

The present invention provides a substrate test apparatus and method capable of measuring a tilt of a substrate by using a substrate tilt measurement device, of obtaining a very precise and accurate substrate image by correcting an optical path deviated from a normal position or a mounting angle of the substrate based on the measured tilt of the substrate, and of greatly increasing reliability and precision of test equipment. However, the above description is an example, and the scope of the present invention is not limited thereto.

According to an aspect of the present invention, there is provided a substrate test apparatus including a lighting device for irradiating illumination light to a substrate, a substrate image detection device for forming an image of the substrate by receiving light reflected from the substrate, and a substrate tilt measurement device for measuring a tilt of the substrate based on a normal angle.

The substrate tilt measurement device may include a measurement light source for generating measurement light, at least one measurement light lens for adjusting a focus of the measurement light, and a first reflection mirror for reflecting at least a portion of the measurement light toward the substrate.

The substrate tilt measurement device may further include a measurement light image detection device for receiving reflected measurement light of the measurement light reflected from the substrate, and forming an image of the reflected measurement light.

The measurement light image detection device may include a 4-slice image sensor including at least four slices to detect a first-direction deviation and a second-direction deviation of the reflected measurement light from a normal position.

The measurement light image detection device may include a first image sensor including at least two slices disposed in a first direction to detect a first-direction deviation of the reflected measurement light from a normal position, and a second image sensor including at least two slices disposed in a second direction to detect a second-direction deviation of the reflected measurement light from the normal position.

The substrate test apparatus may further include an optical path correction device for correcting an optical path of the light reflected from the substrate, based on the tilt of the substrate, and a first controller for receiving tilt information from the substrate tilt measurement device and applying an optical path correction control signal to the optical path correction device.

The optical path correction device may include an optical path correction reflector for reflecting the reflected light to the substrate image detection device, and a reflector angle adjustment device capable of inclining the optical path correction reflector in a first axis direction or a second axis direction.

The reflector angle adjustment device may include a first reflector actuator disposed in the first axis direction from a joint connected to the optical path correction reflector, to move a portion of the optical path correction reflector forward or backward, and a second reflector actuator disposed in the second axis direction from the joint connected to the optical path correction reflector, to move another portion of the optical path correction reflector forward or backward.

The first controller may receive first-direction tilt information from the substrate tilt measurement device and apply a first-direction optical path correction control signal to the first or second reflector actuator to compensate for the first-direction tilt information, and receive second-direction tilt information from the substrate tilt measurement device and apply a second-direction optical path correction control signal to the first or second reflector actuator to compensate for the second-direction tilt information.

The substrate test apparatus may further include a substrate mounting angle correction device for correcting a mounting angle of the substrate based on the tilt of the substrate, and a second controller for receiving tilt information from the substrate tilt measurement device and applying a substrate angle correction control signal to the substrate mounting angle correction device.

The substrate mounting angle correction device may include a substrate stage on which the substrate is mounted, and a stage angle adjustment device capable of inclining the substrate stage in a first axis direction or a second axis direction.

The stage angle adjustment device may include a first stage actuator disposed in the first axis direction from a joint connected to the substrate stage, to move a portion of the substrate stage forward or backward, and a second stage actuator disposed in the second axis direction from the joint connected to the substrate stage, to move another portion of the substrate stage forward or backward.

The second controller may receive first-direction tilt information from the substrate tilt measurement device and apply a first-direction substrate angle correction control signal to the first or second stage actuator to compensate for the first-direction tilt information, and receive second-direction tilt information from the substrate tilt measurement device and apply a second-direction substrate angle correction control signal to the first or second stage actuator to compensate for the second-direction tilt information.

The lighting device may include an illumination light source for generating the illumination light, at least one illumination light lens for adjusting a focus of the illumination light, and a second reflection mirror for reflecting at least a portion of the illumination light toward the substrate.

The substrate test apparatus may further include an autofocus device for automatically focusing the image of the substrate.

The autofocus device may include an autofocus light source for generating autofocus light, at least one autofocus lens for adjusting a focus of the autofocus light, a third reflection mirror for reflecting the autofocus light toward the substrate, a fourth mirror for reflecting autofocus light reflected from the substrate, and an autofocus test device for testing an autofocus image by receiving the reflected autofocus light.

According to another aspect of the present invention, there is provided a substrate test method including (a) irradiating illumination light to a substrate, (b) forming an image of the substrate by receiving light reflected from the substrate, and (c) measuring a tilt of the substrate based on a normal angle.

The substrate test method may further include (d) correcting an optical path of the reflected light deviated from a normal path due to the tilt of the substrate, toward a substrate image detection device, after step (c).

The substrate test method may further include (e) correcting a mounting angle of the substrate deviated from the normal angle due to the tilt of the substrate, after step (c).

According to another aspect of the present invention, there is provided a substrate test apparatus including a lighting device for irradiating illumination light to a substrate, a substrate image detection device for forming an image of the substrate by receiving light reflected from the substrate, an autofocus device for automatically focusing the image of the substrate, a substrate tilt measurement device for measuring a tilt of the substrate based on a normal angle, an optical path correction device for correcting an optical path of the light reflected from the substrate, based on the tilt of the substrate, and a first controller for receiving tilt information from the substrate tilt measurement device and applying an optical path correction control signal to the optical path correction device, wherein the substrate tilt measurement device includes a measurement light source for generating measurement light, at least one measurement light lens for adjusting a focus of the measurement light, a first reflection mirror for reflecting at least a portion of the measurement light toward the substrate, and a measurement light image detection device for receiving reflected measurement light of the measurement light reflected from the substrate, and forming an image of the reflected measurement light, and wherein the measurement light image detection device includes a 4-slice image sensor including at least four slices to detect a first-direction deviation and a second-direction deviation of the measurement light from a normal position, or a first image sensor including at least two slices disposed in a first direction to detect a first-direction deviation of the measurement light from a normal position, and a second image sensor including at least two slices disposed in a second direction to detect a second-direction deviation of the measurement light from the normal position.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
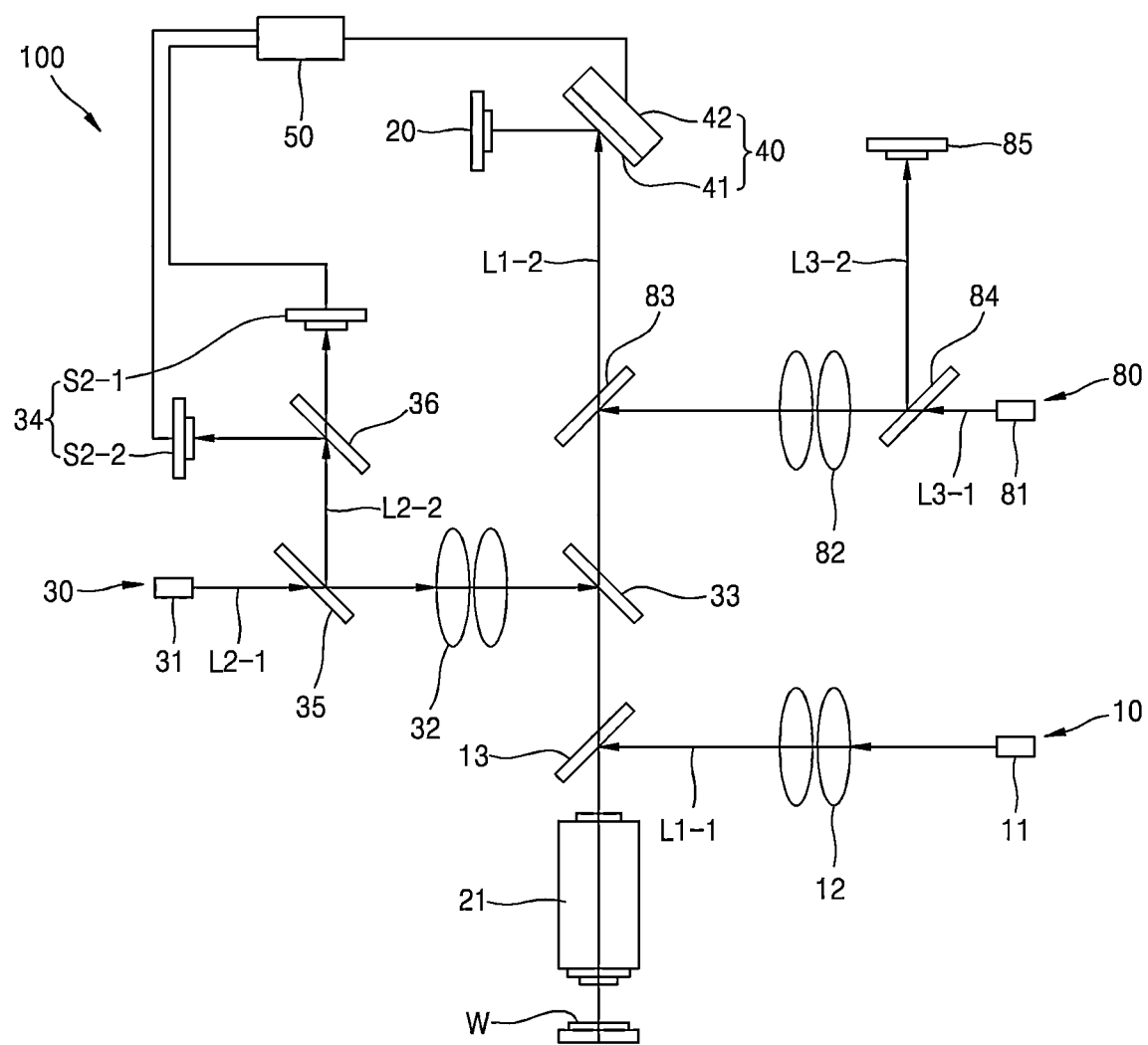
FIG. 1 is a conceptual view of a substrate test apparatus according to some embodiments of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation.

The terminology used herein is for the purpose of describing particular embodiments and is not intended to limit the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, components, and/or groups thereof, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

FIG. 1 is a conceptual view of a substrate test apparatus 100 according to some embodiments of the present invention.

Initially, as shown in FIG. 1, the substrate test apparatus 100 according to some embodiments of the present invention may be an apparatus capable of testing or measuring a substrate such as a wafer, a semiconductor chip, a semiconductor package, or a printed circuit board by obtaining an optical image from the substrate, and mainly include a lighting device 10, a substrate image detection device 20, and a substrate tilt measurement device 30.

For example, the lighting device 10 may be a device capable of irradiating illumination light L1-1 to a substrate W. Specifically, for example, the lighting device may include an illumination light source 11 for generating the illumination light L1-1, at least one illumination light lens 12 for adjusting a focus of the illumination light L1-1, and a second reflection mirror 13 for reflecting at least a portion of the illumination light L1-1 toward the substrate W.

Herein, for example, the illumination light source 11 may use any of various lamps (e.g., a halogen lamp, an infrared lamp, a visible light lamp, and a fluorescent lamp), various light-emitting elements (e.g., a light-emitting diode (LED) and an organic light-emitting diode (OLED)), various light-emitting devices, and various light sources.

For example, the illumination light lens 12 may use any of various types of lenses or combinations of lenses for adjusting a focus of or changing an optical path of the illumination light L1-1, and the second reflection mirror 13 may use a half mirror to reflect a part of light and transmit the other part of the light.

However, the lighting device 10 is not limited to the illustration and may also use any of various other types of lighting optics.

Therefore, when the lighting device 10 is used, the illumination light L1-1 may be sufficiently irradiated to the substrate W, and an image of the substrate W may be obtained by receiving reflected light L1-2 of the illumination light L1-1.

For example, the substrate image detection device 20 may be a device for forming an image of the substrate W by receiving the light L1-2 reflected from the substrate W, and use any of various types of image acquisition devices (e.g., an image sensor, a light-receiving sensor, a light-receiving element, a photosensitive sensor, a photosensor, a detector, and a camera).

Herein, in addition to the sensors, the substrate image detection device 20 may further include an object lens 21 or the like mounted on an optical path of the reflected light L1-2 to obtain a clear and precise image at various magnifications.

However, the substrate image detection device 20 is not limited to the illustration and may also use any of various other types of image detection optics.

Meanwhile, the substrate tilt measurement device 30 of the substrate test apparatus 100 according to some embodiments of the present invention may be a measurement device for measuring a tilt of the substrate W based on a normal angle, e.g., a horizontal state.

For example, the substrate tilt measurement device 30 may include a measurement light source 31 for generating measurement light L2-1 such as pointed light or cross-shaped light, at least one measurement light lens 32 for adjusting a focus of the measurement light L2-1, a first reflection mirror 33 for reflecting at least a portion of the measurement light L2-1 toward the substrate W, and a measurement light image detection device 34 for receiving reflected measurement light L2-2 of the measurement light L2-1 reflected from of the substrate W, and forming an image of the reflected measurement light L2-2.

Herein, for example, the measurement light source 31 may use any of various laser light-emitting elements, various lamps (e.g., a halogen lamp, an infrared lamp, a visible light lamp, and a fluorescent lamp), various light-emitting elements (e.g., a LED and an OLED), various light-emitting devices, and various light sources to generate the measurement light L2-1 such as pointed light, grid-shaped light, or cross-shaped light which is easily identifiable.

For example, the measurement light lens 32 may use any of various types of lenses or combinations of lenses for adjusting a focus of or changing an optical path of the illumination light L1-1, and the first reflection mirror 33 may use a half mirror to reflect a part of light and transmit the other part of the light.

For example, the measurement light image detection device 34 may be a device for receiving the measurement light L2-2 reflected from the substrate W, and forming an image of the reflected measurement light L2-2, and use any of various types of image acquisition devices (e.g., an image sensor, a light-receiving sensor, a light-receiving element, a photosensitive sensor, a photosensor, a detector, and a camera).

However, the measurement light image detection device 34 is not limited to the illustration and may also use any of various other types of image detection optics.

Figure 2:
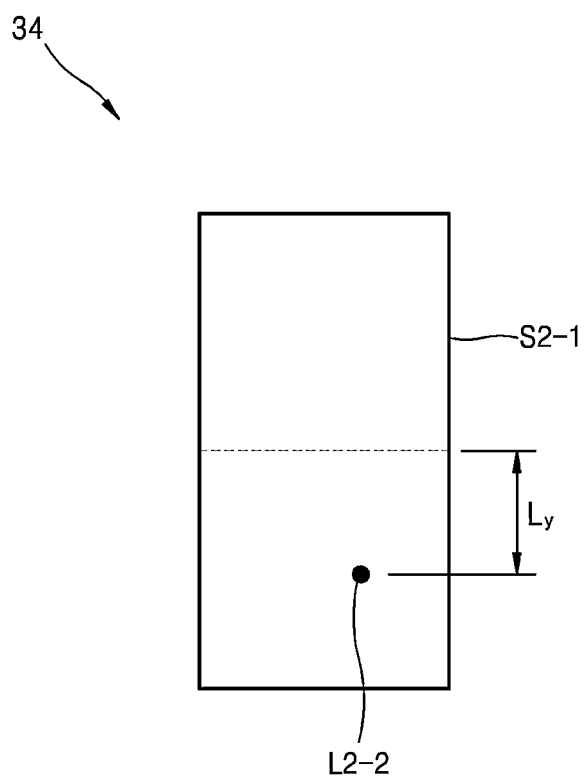
FIG. 2 is a conceptual view of an example of a measurement light image detection device of the substrate test apparatus of FIG. 1.
Figure 3:
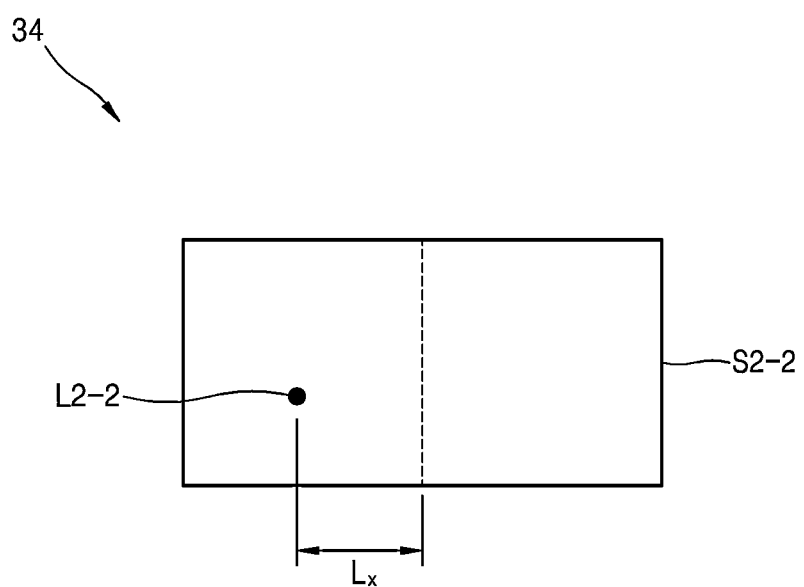
FIG. 3 is a conceptual view of another example of the measurement light image detection device of the substrate test apparatus of FIG. 1.

FIG. 2 is a conceptual view of an example of the measurement light image detection device 34 of the substrate test apparatus 100 of FIG. 1, and FIG. 3 is a conceptual view of another example of the measurement light image detection device 34 of the substrate test apparatus 100 of FIG. 1.

Specifically, for example, as shown in FIGS. 2 and 3, the measurement light image detection device 34 may include a first image sensor S2-1 including at least two slices disposed in a first direction to detect a first-direction deviation of the reflected measurement light L2-2 from a normal position, and a second image sensor S2-2 including at least two slices disposed in a second direction to detect a second-direction deviation of the reflected measurement light L2-2 from the normal position.

Therefore, as shown in FIGS. 1 to 3, a first-direction deviation Ly of the reflected measurement light L2-2 from the normal position may be detected using the first image sensor S2-1, a second-direction deviation Lx of the reflected measurement light L2-2 from the normal position may be detected using the second image sensor S2-2, and thus the first-direction and second-direction deviations may be accurately measured.

Herein, the first direction may refer to a Y-axis direction or an X-axis direction and the second direction may refer to the X-axis direction or the Y-axis direction. Alternatively, for example, the first and second directions may refer to various directions which form an angle of 90° therebetween, e.g., a tilt direction and a tip direction.

Figure 4:
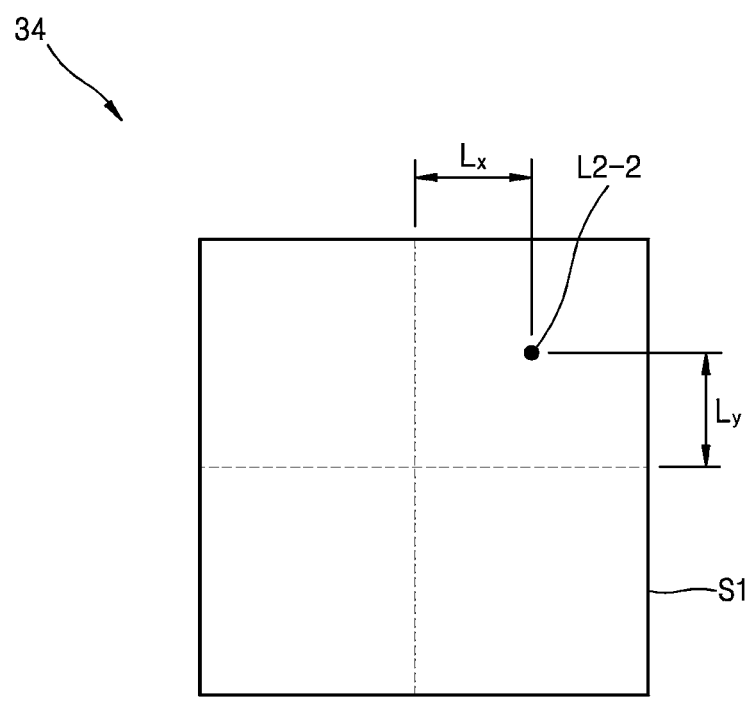
FIG. 4 is a conceptual view of another example of the measurement light image detection device of the substrate test apparatus of FIG. 1.

FIG. 4 is a conceptual view of another example of the measurement light image detection device 34 of the substrate test apparatus 100 of FIG. 1.

As shown in FIG. 4, the measurement light image detection device 34 may include a 4-slice image sensor S1 including at least four slices to detect the first-direction and second-direction deviations Ly and Lx of the measurement light L2-1 from the normal position.

Therefore, as shown in FIGS. 1 to 4, the first-direction and second-direction deviations Ly and Lx of the reflected measurement light L2-2 from the normal position may be accurately measured using the 4-slice image sensor S1.

For example, the substrate tilt measurement device 30 may further include a first-1 reflection mirror 35 mounted on an optical path of the reflected measurement light L2-2 to reflect the reflected measurement light L2-2 more clearly toward the measurement light image detection device 34, and a first-2 reflection mirror 36 provided as a half mirror mounted on the optical path of the reflected measurement light L2-2 to split the reflected measurement light L2-2 toward the first and second image sensors S2-1 and S2-2.

Figure 5:
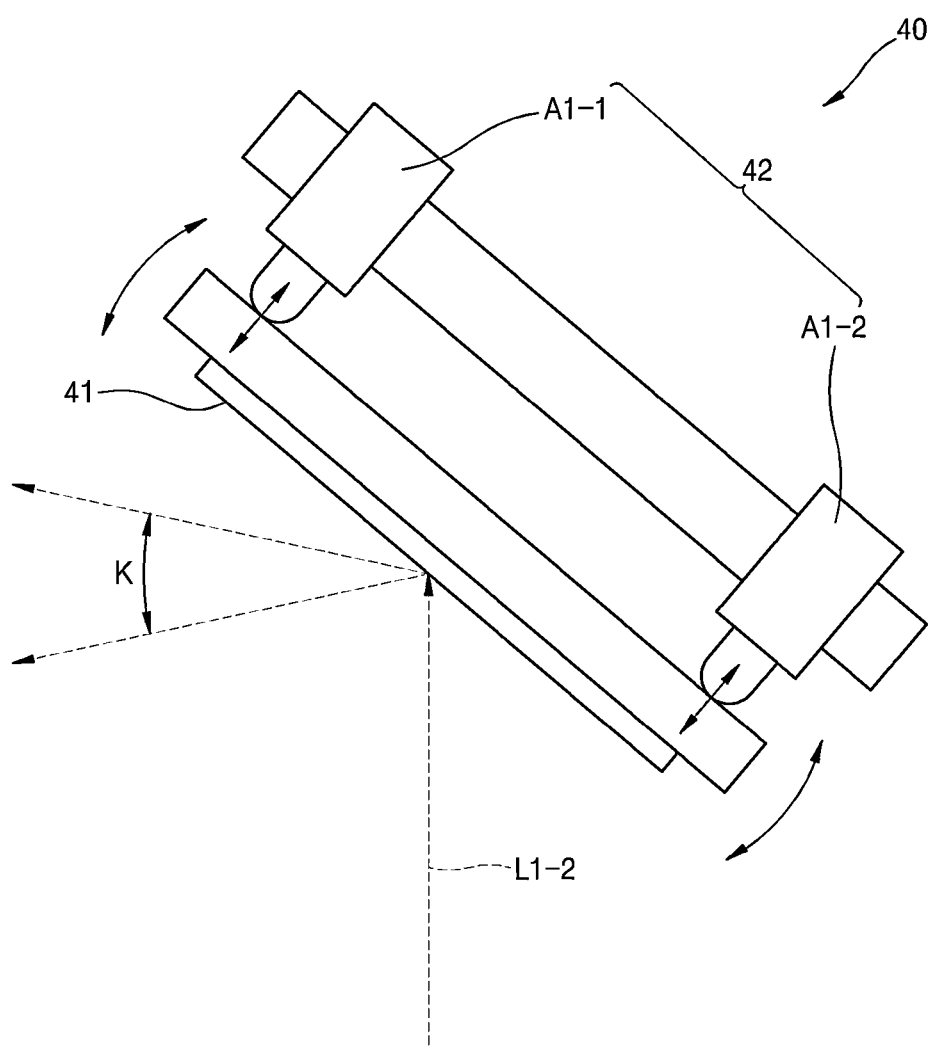
FIG. 5 is a side view of an optical path correction device of the substrate test apparatus of FIG. 1.
Figure 6:
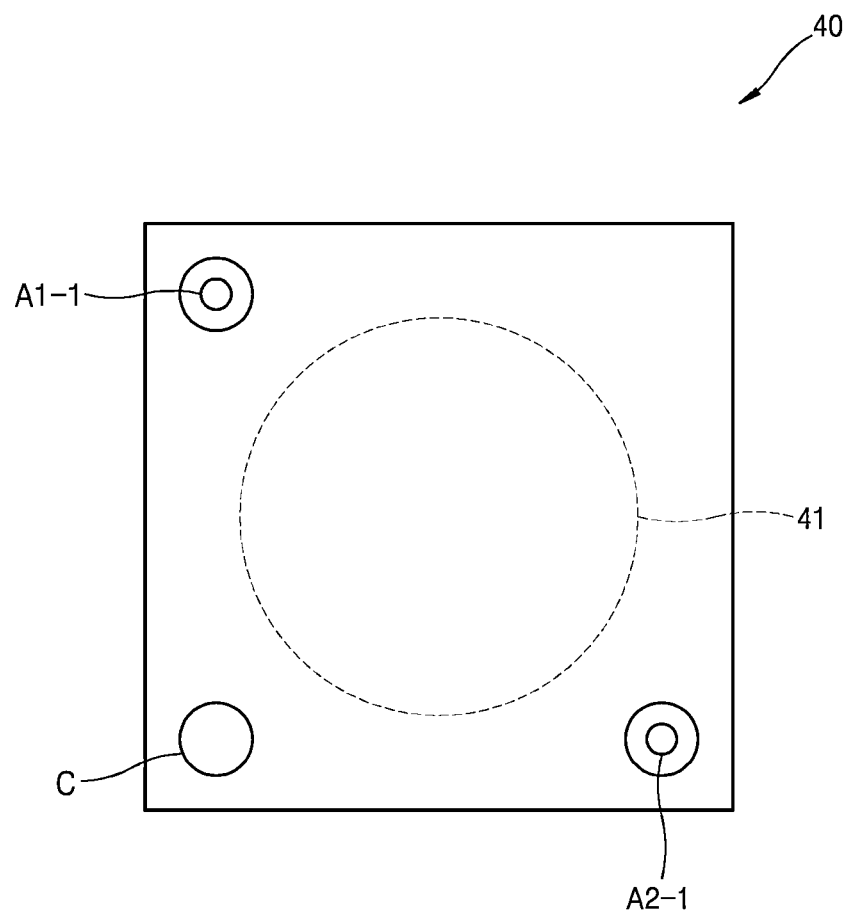
FIG. 6 is a plan view of the optical path correction device of the substrate test apparatus of FIG. 5.

FIG. 5 is a side view of an optical path correction device 40 of the substrate test apparatus 100 of FIG. 1, and FIG. 6 is a plan view of the optical path correction device of the substrate test apparatus 100 of FIG. 5.

As shown in FIGS. 5 and 6, the substrate test apparatus 100 according to some embodiments of the present invention may further include the optical path correction device 40 for correcting the optical path of the light L1-2 reflected from the substrate W, based on the tilt of the substrate W, and a first controller 50 for receiving tilt information from the substrate tilt measurement device 30 and applying an optical path correction control signal to the optical path correction device 40.

For example, as shown in FIGS. 1 to 6, the optical path correction device 40 may include an optical path correction reflector 41 for reflecting the reflected light L1-2 to the substrate image detection device 20, and a reflector angle adjustment device 42 capable of inclining the optical path correction reflector 41 in a first axis direction or a second axis direction.

As shown in FIGS. 5 and 6, the reflector angle adjustment device 42 may include a first reflector actuator A1-1 disposed in the first axis direction from a joint C connected to the optical path correction reflector 41, to move a portion of the optical path correction reflector 41 forward or backward, and a second reflector actuator A1-2 disposed in the second axis direction from the joint C connected to the optical path correction reflector 41, to move another portion of the optical path correction reflector 41 forward or backward.

Herein, the first controller 50 may receive first-direction tilt information from the substrate tilt measurement device 30 and apply a first-direction optical path correction control signal to the first or second reflector actuator A1-1 or A1-2 to compensate for the first-direction tilt information, and receive second-direction tilt information from the substrate tilt measurement device 30 and apply a second-direction optical path correction control signal to the first or second reflector actuator A1-1 or A1-2 to compensate for the second-direction tilt information.

Therefore, as shown in FIGS. 5 and 6, the first controller 50 may adjust the optical path of the light L1-2 reflected from the substrate W, within a reflection angle adjustment range K of the optical path correction reflector 41 based on the tilt of the substrate W by receiving the first-direction and second-direction tilt information from the substrate tilt measurement device 30 and applying the first-direction and second-direction optical path correction control signals to the first reflector actuator A1-1 and/or the second reflector actuator A1-2 to compensate for the first-direction and second-direction tilt information.

That is, for example, the illumination light L1-1 may be irradiated to the substrate W by using the lighting device 10, the image of the substrate W may be formed by receiving the light L1-2 reflected from the substrate W by using the substrate image detection device 20, the tilt of the substrate W based on the normal angle in this case may be measured using the substrate tilt measurement device 30, and the optical path of the reflected light L1-2 deviated from a normal path due to the tilt of the substrate W may be corrected toward the substrate image detection device 20 by using the optical path correction device 40.

Therefore, the tilt of the substrate W may be measured using the substrate tilt measurement device 30, a very precise and accurate substrate image may be obtained by correcting the optical path deviated from the normal position based on the measured tilt of the substrate W, reliability and precision of test equipment may be greatly increased, and reliability of data may be greatly increased by adding an angle component as a new parameter to a test or measurement algorithm.

Meanwhile, as shown in FIG. 1, the substrate test apparatus 100 according to some embodiments of the present invention may further include an autofocus device 80 for automatically focusing the image of the substrate W.

Specifically, for example, the autofocus device 80 may include an autofocus light source 81 for generating autofocus light L3-1, at least one autofocus lens 82 for adjusting a focus of the autofocus light L3-1, a third reflection mirror 83 for reflecting the autofocus light L3-1 toward the substrate W, a fourth mirror 84 for reflecting autofocus light L3-2 reflected from the substrate W, and an autofocus test device 85 for testing an autofocus image by receiving the reflected autofocus light L3-2.

However, the autofocus device 80 is not limited to the illustration and may be omitted or use any of various types of autofocus optics.

Figure 7:
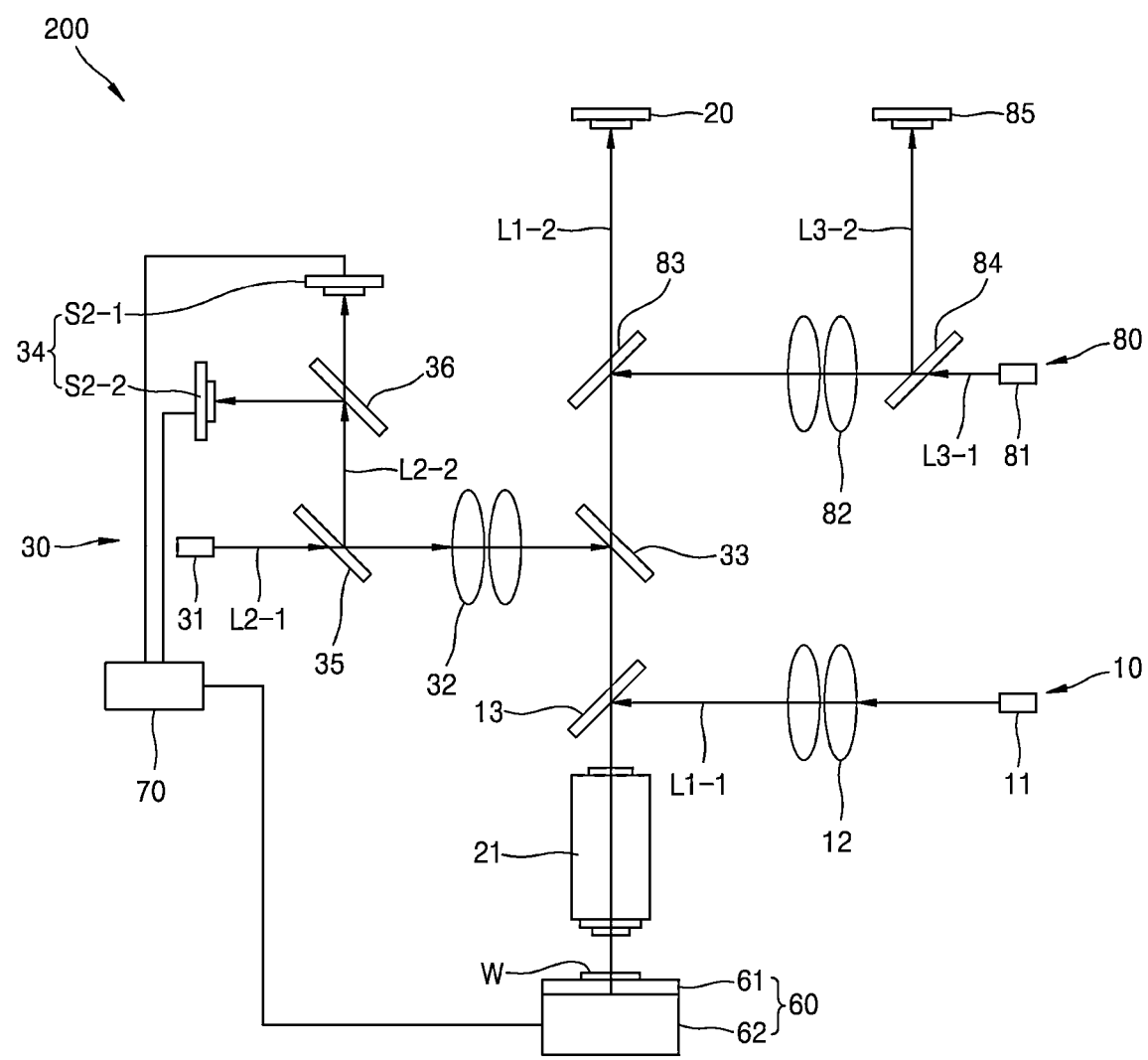
FIG. 7 is a conceptual view of a substrate test apparatus according to other embodiments of the present invention.
Figure 8:
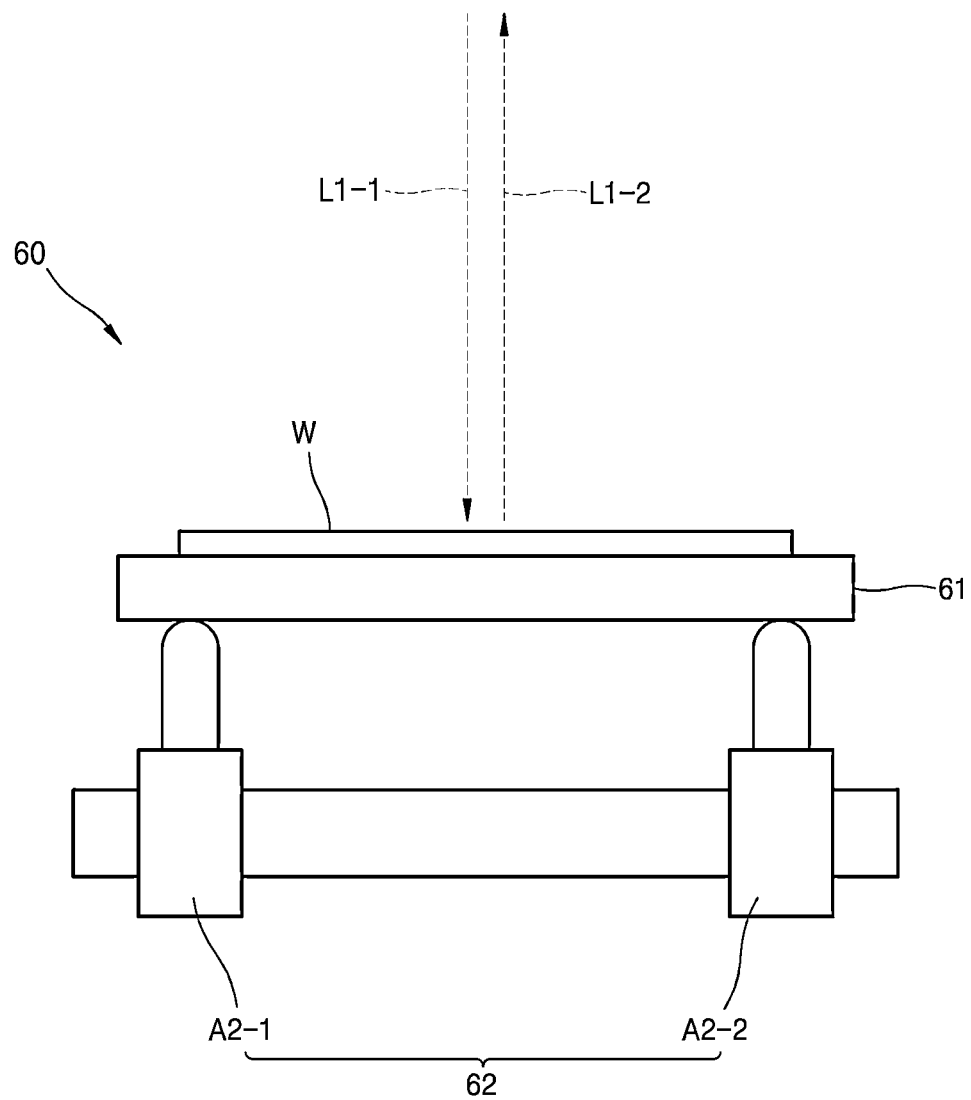
FIG. 8 is a side view of a substrate mounting angle correction device of the substrate test apparatus of FIG. 7.
Figure 9:
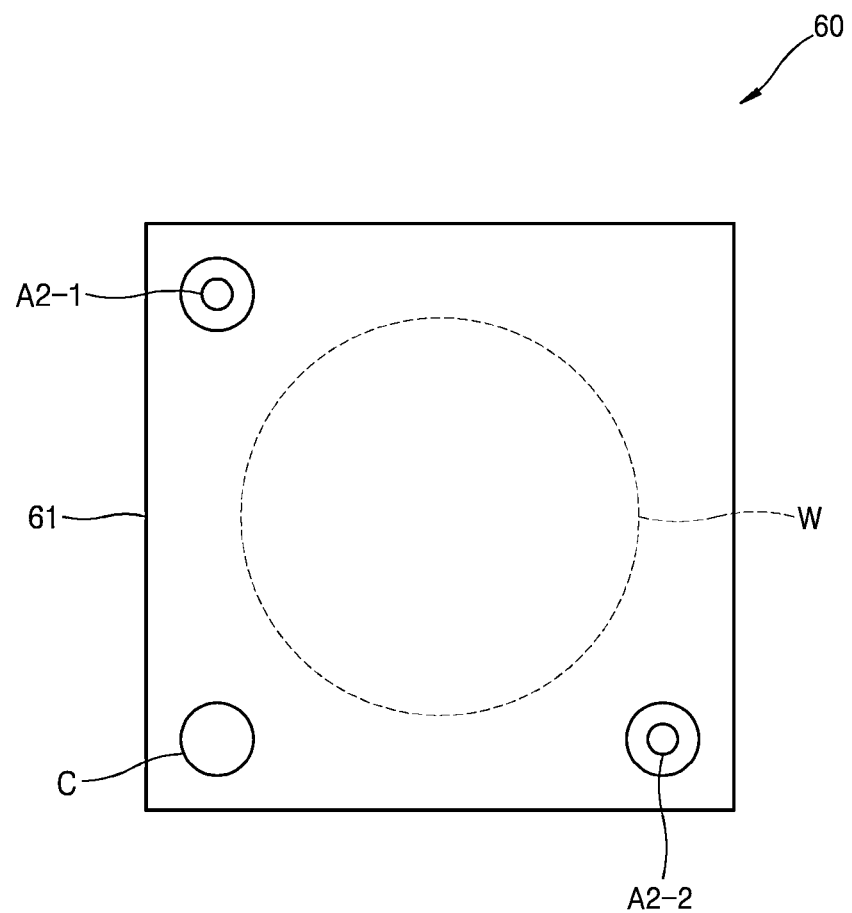
FIG. 9 is a plan view of the substrate mounting angle correction device of the substrate test apparatus of FIG. 8.

FIG. 7 is a conceptual view of a substrate test apparatus 200 according to other embodiments of the present invention, FIG. 8 is a side view of a substrate mounting angle correction device 60 of the substrate test apparatus 200 of FIG. 7, and FIG. 9 is a plan view of the substrate mounting angle correction device 60 of the substrate test apparatus 200 of FIG. 8.

As shown in FIGS. 7 to 9, the substrate test apparatus 200 according to other embodiments of the present invention may further include the substrate mounting angle correction device 60 for correcting a mounting angle of the substrate W based on the tilt of the substrate W, and a second controller 70 for receiving tilt information from the substrate tilt measurement device 30 and applying a substrate angle correction control signal to the substrate mounting angle correction device 60.

Specifically, for example, the substrate mounting angle correction device 60 may include a substrate stage 61 on which the substrate W is mounted, and a stage angle adjustment device 62 capable of inclining the substrate stage 61 in a first axis direction or a second axis direction.

For example, as shown in FIGS. 8 and 9, the stage angle adjustment device 62 may include a first stage actuator A2-1 disposed in the first axis direction from a joint C connected to the substrate stage 61, to move a portion of the substrate stage 61 forward or backward, and a second stage actuator A2-2 disposed in the second axis direction from the joint C connected to the substrate stage 61, to move another portion of the substrate stage 61 forward or backward.

For example, the second controller 70 may receive first-direction tilt information from the substrate tilt measurement device 30 and apply a first-direction substrate angle correction control signal to the first or second stage actuator A2-1 or A2-2 to compensate for the first-direction tilt information, and receive second-direction tilt information from the substrate tilt measurement device and apply a second-direction substrate angle correction control signal to the first or second stage actuator A2-1 or A2-2 to compensate for the second-direction tilt information.

Therefore, as shown in FIGS. 7 to 9, the second controller 70 may correct an angle of the substrate stage 61 to adjust the mounting angle of the substrate W based on the tilt of the substrate W by receiving the first-direction and second-direction tilt information from the substrate tilt measurement device 30 and applying the first-direction and second-direction substrate angle correction control signals to the first stage actuator A2-1 and/or the second stage actuator A2-2 to compensate for the first-direction and second-direction tilt information.

That is, for example, the illumination light L1-1 may be irradiated to the substrate W by using the lighting device 10, the image of the substrate W may be formed by receiving the light L1-2 reflected from the substrate W by using the substrate image detection device 20, the tilt of the substrate W based on the normal angle in this case may be measured using the substrate tilt measurement device 30, and the mounting angle of the substrate W deviated from the normal angle due to the tilt of the substrate W may be corrected using the substrate mounting angle correction device 60.

Therefore, the tilt of the substrate W may be measured using the substrate tilt measurement device 30, a very precise and accurate substrate image may be obtained by correcting the mounting angle of the substrate W based on the measured tilt of the substrate W, reliability and precision of test equipment may be greatly increased, and reliability of data may be greatly increased by adding an angle component as a new parameter to a test or measurement algorithm.

Figure 10:
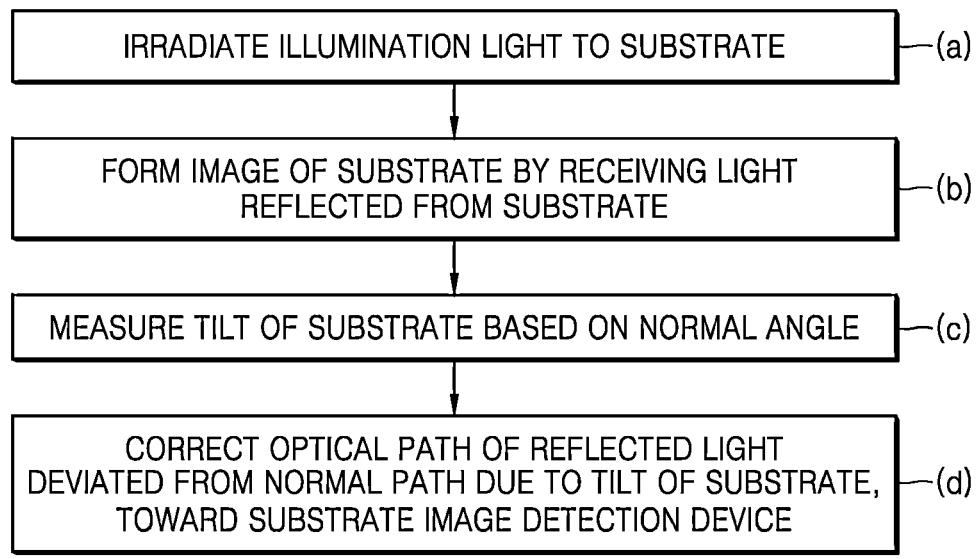
FIG. 10 is a flowchart of a substrate test method according to some embodiments of the present invention.

FIG. 10 is a flowchart of a substrate test method according to some embodiments of the present invention.

As shown in FIGS. 1 to 10, the substrate test method according to some embodiments of the present invention may include (a) irradiating the illumination light L1-1 to the substrate W, (b) forming an image of the substrate W by receiving the light L1-2 reflected from the substrate W, (c) measuring a tilt of the substrate W based on a normal angle, and (d) correcting an optical path of the reflected light L1-2 deviated from a normal path due to the tilt of the substrate W, toward the substrate image detection device 20.

Figure 11:
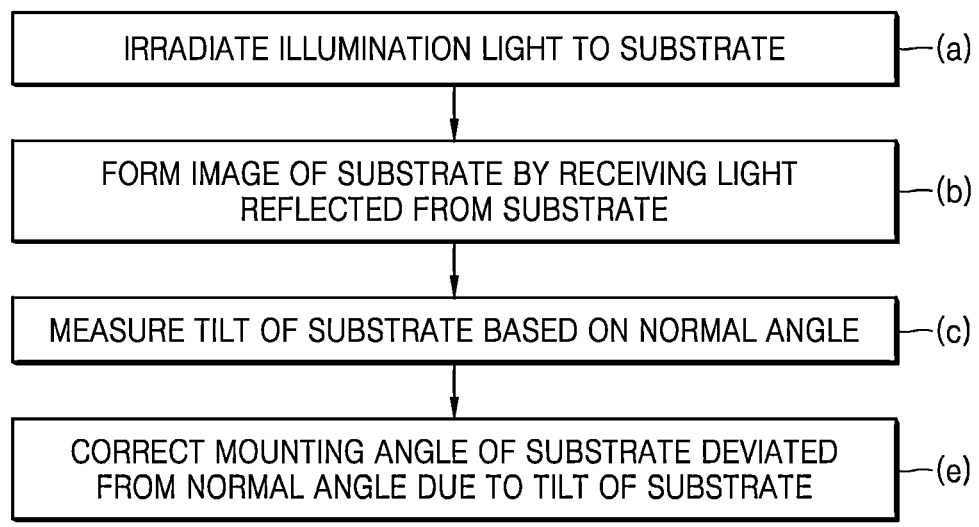
FIG. 11 is a flowchart of a substrate test method according to other embodiments of the present invention.

FIG. 11 is a flowchart of a substrate test method according to other embodiments of the present invention.

As shown in FIGS. 1 to 11, the substrate test method according to other embodiments of the present invention may include (a) irradiating the illumination light L1-1 to the substrate W, (b) forming an image of the substrate W by receiving the light L1-2 reflected from the substrate W, (c) measuring a tilt of the substrate W based on a normal angle, and (e) correcting a mounting angle of the substrate W deviated from the normal angle due to the tilt of the substrate W.

According to the afore-described embodiments of the present invention, a tilt of a substrate may be measured using a substrate tilt measurement device, a very precise and accurate substrate image may be obtained by correcting an optical path deviated from a normal position or a mounting angle of the substrate based on the measured tilt of the substrate, reliability and precision of test equipment may be greatly increased, and reliability of data may be greatly increased by adding an angle component as a new parameter to a test or measurement algorithm. However, the scope of the present invention is not limited to the above effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A substrate test apparatus comprising:
   a lighting device configured to irradiate illumination light on a substrate;
   a substrate image detection device configured to form an image of the substrate by receiving light reflected from the substrate;
   a substrate tilt measurement device configured to measure a tilt of the substrate based on a horizontal position of the substrate; and
   a controller configured to receive tilt information from the substrate tilt measurement device and configured to correct an optical path of the light reflected from the substrate.

2. The substrate test apparatus of claim 1, wherein the substrate tilt measurement device comprises:
   a measurement light source configured to generate measurement light;
   at least one measurement light lens configured to adjust a focus of the measurement light; and
   a first reflection mirror configured to reflect at least a portion of the measurement light toward the substrate.

3. The substrate test apparatus of claim 2, wherein the substrate tilt measurement device further comprises a measurement light image detection device configured to receive reflected measurement light of the measurement light reflected from the substrate, and configured to form an image using the reflected measurement light.

4. The substrate test apparatus of claim 3, wherein the measurement light image detection device comprises a 4-slice image sensor comprising at least four slices configured to detect a first-direction deviation and a second-direction deviation of the reflected measurement light from the horizontal position.

5. The substrate test apparatus of claim 3, wherein the measurement light image detection device comprises:
   a first image sensor comprising at least two slices in a first direction and configured to detect a first-direction deviation of the reflected measurement light from the horizontal position; and
   a second image sensor comprising at least two slices in a second direction and configured to detect a second-direction deviation of the reflected measurement light from the horizontal position.

6. The substrate test apparatus of claim 1, further comprising:
   an optical path correction device configured to correct the optical path of the light reflected from the substrate based on the tilt of the substrate, wherein
   the controller is configured to apply an optical path correction control signal to the optical path correction device to correct the optical path of the light reflected from the substrate.

7. The substrate test apparatus of claim 6, wherein the optical path correction device comprises:
an optical path correction reflector configured to reflect the light reflected from the substrate image detection device; and
a reflector angle adjustment device configured to incline the optical path correction reflector in a first axis direction or a second axis direction.

8. The substrate test apparatus of claim 7, wherein the reflector angle adjustment device comprises:
a first reflector actuator in the first axis direction from a joint connected to the optical path correction reflector, and configured to move a portion of the optical path correction reflector forward or backward; and
a second reflector actuator in the second axis direction from the joint connected to the optical path correction reflector, and configured to move another portion of the optical path correction reflector forward or backward.

9. The substrate test apparatus of claim 8, wherein the controller is configured to:
receive first-direction tilt information from the substrate tilt measurement device and apply a first-direction optical path correction control signal to the first or second reflector actuator to compensate for the first-direction tilt information; and
receive second-direction tilt information from the substrate tilt measurement device and apply a second-direction optical path correction control signal to the first or second reflector actuator to compensate for the second-direction tilt information.

10. The substrate test apparatus of claim 1, further comprising:
a substrate mounting angle correction device configured to correct a mounting angle of the substrate based on the tilt of the substrate, wherein
the controller is configured to apply a substrate angle correction control signal to the substrate mounting angle correction device to correct the optical path of the light reflected from the substrate.

11. The substrate test apparatus of claim 10, wherein the substrate mounting angle correction device comprises:
a substrate stage on which the substrate is mounted; and
a stage angle adjustment device configured to incline the substrate stage in a first axis direction or a second axis direction.

12. The substrate test apparatus of claim 11, wherein the stage angle adjustment device comprises:
a first stage actuator in the first axis direction from a joint connected to the substrate stage, and configured to move a portion of the substrate stage forward or backward; and
a second stage actuator in the second axis direction from the joint connected to the substrate stage, and configured to move another portion of the substrate stage forward or backward.

13. The substrate test apparatus of claim 12, wherein the controller is configured to:
receive first-direction tilt information from the substrate tilt measurement device and apply applies a first-direction substrate angle correction control signal to the first or second stage actuator to compensate for the first-direction tilt information; and
receive second-direction tilt information from the substrate tilt measurement device and apply a second-direction substrate angle correction control signal to the first or second stage actuator to compensate for the second-direction tilt information.

14. The substrate test apparatus of claim 1, wherein the lighting device comprises:
an illumination light source configured to generate the illumination light;
at least one illumination light lens configured to adjust a focus of the illumination light; and
a second reflection mirror configured to reflect at least a portion of the illumination light toward the substrate.

15. The substrate test apparatus of claim 1, further comprising an autofocus device configured to automatically focus the image of the substrate.

16. The substrate test apparatus of claim 15, wherein the autofocus device comprises:
an autofocus light source configured to generate autofocus light;
at least one autofocus lens configured to adjust a focus of the autofocus light;
a third reflection mirror configured to reflect the autofocus light toward the substrate;
a fourth mirror configured to reflect the autofocus light reflected from the substrate; and
an autofocus test device configured to test an autofocus image by receiving the autofocus light reflected by the fourth mirror.

17. A substrate test method comprising:
irradiating illumination light to a substrate;
forming an image of the substrate by receiving light reflected from the substrate;
measuring a tilt of the substrate based on a horizontal position of the substrate to obtain a measured tilt of the substrate; and
correcting an optical path of the light reflected from the substrate based on the measured tilt of the substrate.

18. The substrate test method of claim 17, wherein
the correcting the optical path of the light reflected from the substrate includes correcting the optical path of the light reflected from the substrate toward a substrate image detection device, the light reflected from the substrate being deviated from a normal path due to the tilt of the substrate.

19. The substrate test method of claim 17, wherein
the correcting the optical path of the light reflected from the substrate includes correcting a mounting angle of the substrate to correct the optical path of the light reflected from the substrate, and wherein the substrate is deviated from the horizontal position due to the tilt of the substrate.

20. A substrate test apparatus comprising:
a lighting device configured to irradiate illumination light to a substrate;
a substrate image detection device configured to form an image of the substrate by receiving light reflected from the substrate;
an autofocus device configured to automatically focus the image of the substrate;
a substrate tilt measurement device configured to measure a tilt of the substrate based on a horizontal position of the substrate;
an optical path correction device configured to correct an optical path of the light reflected from the substrate, based on the tilt of the substrate; and
a first controller configured to receive tilt information from the substrate tilt measurement device and apply an optical path correction control signal to the optical path correction device, wherein the substrate tilt measurement device comprises:
  a measurement light source configured to generate measurement light;
  at least one measurement light lens configured to adjust a focus of the measurement light;
  a first reflection mirror configured to reflect at least a portion of the measurement light toward the substrate; and
  a measurement light image detection device configured to receive reflected measurement light of the measurement light reflected from the substrate, and configured to form an image using the reflected measurement light, and
wherein the measurement light image detection device comprises:
  a 4-slice image sensor comprising at least four slices configured to detect a first-direction deviation and a second-direction deviation of the measurement light from the horizontal position; or
  a first image sensor comprising at least two slices in a first direction configured to detect a first-direction deviation of the measurement light from the horizontal position; and
  a second image sensor comprising at least two slices in a second direction configured to detect a second-direction deviation of the measurement light from the horizontal position.

* * * * *